US007187223B2

(12) United States Patent
Yeo et al.

(10) Patent No.: US 7,187,223 B2
(45) Date of Patent: Mar. 6, 2007

(54) COMPARATOR WITH HYSTERESIS

(75) Inventors: Kok-Soon Yeo, Singapore (SG); Lian-Chun Xu, Singapore (SG); Chee-Keong Teo, Singapore (SG); John Julius de Leon Asuncion, Singapore (SG); Wai-Keat Tai, Singapore (SG)

(73) Assignee: Avago Technologies ECBU (IP) Singapore Pte. Ltd. (SG)

( * ) Notice: Subject to any disclaimer, the term of this patent is extended or adjusted under 35 U.S.C. 154(b) by 83 days.

(21) Appl. No.: 11/057,244

(22) Filed: Feb. 14, 2005

(65) Prior Publication Data

US 2006/0181314 A1 Aug. 17, 2006

(51) Int. Cl.
*H03K 3/00* (2006.01)

(52) U.S. Cl. ...................................... 327/206; 327/205

(58) Field of Classification Search ................ 327/205, 327/206

See application file for complete search history.

(56) References Cited

U.S. PATENT DOCUMENTS 3,612,912 A * 10/1971 Schwartz .................... 327/205
4,408,132 A * 10/1983 Kuwahara .................. 327/205
5,362,994 A * 11/1994 Lin ............................ 327/72
5,528,185 A 6/1996 Lewicki et al.
6,229,350 B1 5/2001 Ricon-Mora
6,407,605 B1 * 6/2002 McCann ..................... 327/205
6,538,476 B2 * 3/2003 Forbes ........................ 327/57

* cited by examiner

*Primary Examiner*—Kenneth B. Wells

(57) ABSTRACT

In one embodiment, a comparator is provided with a first differential input stage that receives an input voltage and a reference voltage and produces a first differential output, and a second differential input stage that has differential inputs and produces a second differential output. A comparator stage produces a comparator output in response to the first and second differential outputs. The comparator also has a hysteresis control circuit, the components of which include 1) a resistor and a hysteresis regulating voltage input, coupled between the differential inputs of the second differential input stage, 2) first and second current generators, and 3) at least one switch, under control of the comparator output, to alternately enable different combinations of the first and second current generators, thereby inducing a first or a second current through the resistor.

17 Claims, 5 Drawing Sheets

COMPARATOR WITH HYSTERESIS

BACKGROUND

Comparators are used in many applications, including analog-to-digital converters, data transmission components (e.g. infrared transceivers), and switching power regulators.

Some comparators are provided with "hysteresis", which can be defined as a comparator's varying response to rising and falling input signal edges. In many cases, hysteresis is used to prevent a comparator's output from oscillating as a result of noise in the vicinity of a signal's edges.

SUMMARY OF THE INVENTION

In one embodiment, a comparator comprises a first differential input stage receiving an input voltage and a reference voltage and producing a first differential output, and a second differential input stage having differential inputs and producing a second differential output. The comparator further comprises a comparator stage that produces a comparator output in response to the first and second differential outputs. The comparator also comprises a hysteresis control circuit that comprises 1) a resistor and a hysteresis regulating voltage input, coupled between the differential inputs of the second differential input stage, 2) first and second current generators, and 3) at least one switch, under control of the comparator output, to alternately enable different combinations of the first and second current generators, thereby inducing a first or a second current through the resistor.

In another embodiment, a method for generating a hysteresis voltage between the differential inputs of a comparator comprise 1) coupling a resistor and a hysteresis regulating voltage input between the differential inputs, and 2) alternately inducing a first current or a second current through the resistor, in response to an output of the comparator.

Other embodiments are also disclosed.

BRIEF DESCRIPTION OF THE DRAWINGS

Illustrative and presently preferred embodiments of the invention are illustrated in the drawings, in which.

DETAILED DESCRIPTION OF AN EMBODIMENT

Figure 1:
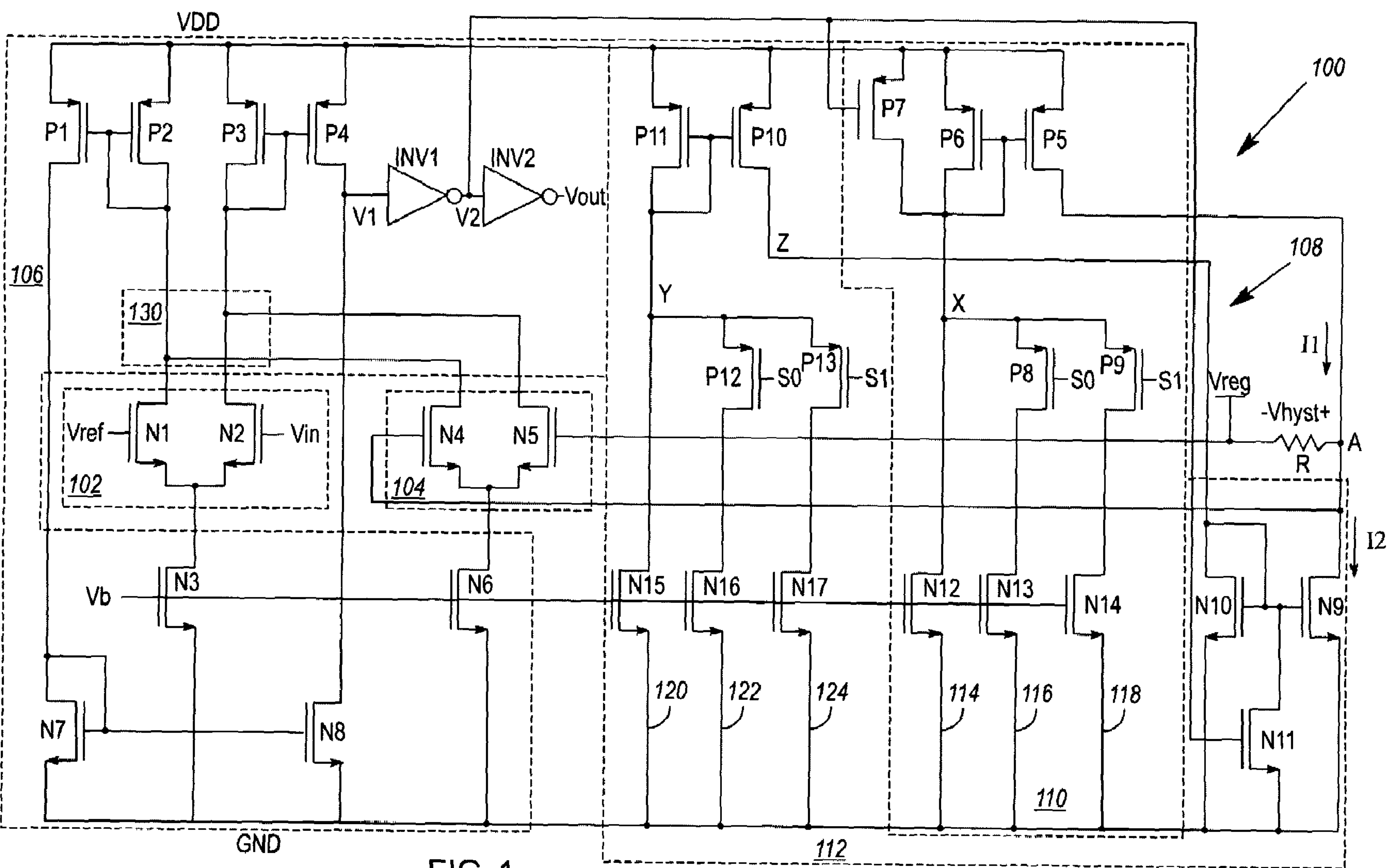
FIG. 1 illustrates an exemplary embodiment of a comparator with hysteresis.

FIG. 1 illustrates an exemplary embodiment of a comparator with hysteresis 100. The comparator 100 comprises a first differential input stage 102 that receives an input voltage (Vin) and a reference voltage (Vref) and produces a first differential output. The comparator 100 also comprises a second differential input stage 104 that receives differential input voltages and produces a second differential output. The comparator 100 further comprises a comparator stage 106 that produces a comparator output (V1, V2, or Vout) in response to the first and second differential outputs. The comparator 100 also comprises a hysteresis control circuit 108 that comprises 1) a resistor (R) and a hysteresis regulating voltage input (Vreg), coupled between the differential inputs of the second differential input stage 104, 2) first and second current generators 110, 112, and 3) at least one switch, under control of the comparator output (e.g., V2), to alternately enable different combinations of the first and second current generators, thereby inducing a first or a second current through the resistor (R). In FIG. 1, the at least one switch comprises a pair of switches (P7, N11) that respectively correspond to the first and second current generators. In use, the switches P7 and N11 may be operated to alternately enable the first current generator or the second current generator, thereby inducing either a first or second current (I1, I2) through the resistor (R).

For purposes of illustrating an exemplary implementation of the comparator 100, FIG. 1 illustrates exemplary connections between a plurality of N-channel and P-channel enhancement type field-effect transistors (FETs). One of skill will recognize that the FETs shown can be replaced with other types, numbers and placements of transistors, depending upon the process used to implement the comparator 100.

As shown in FIG. 1, the first differential input stage 102 may comprise two N-channel FETs (N1, N2), each controlled by one of two inputs to their gate terminals (Vref and Vin). Vref and Vin represent two signals being compared, the first of which (Vref) may be a constant voltage, and the second of which (Vin) may be a varying input signal (such as an analog signal that is being converted to a digital signal). A third FET, N3, is coupled between the source terminals of N1 and N2 and ground (GND). The gate of N3 is controlled by a bias voltage, Vb. In this way, the sum of the current flowing through N1 and N2 is equivalent to the current flowing through N3, and the ratio of current flowing through N1 versus N2 is proportional to the ratio of Vref to Vin. The drains of N1 and N2 provide a first differential output to a differential summing junction 130.

The second differential input stage 104 may comprise FETs N4 and N5, the gates of which are coupled via the resistor, R, of the hysteresis control circuit 108. A hysteresis regulating voltage input (Vreg) is also coupled between the gates of N4 and N5. A third FET, N6, is coupled between the source terminals of N4 and N5 and ground (GND). The gate of N6 is controlled by the bias voltage, Vb. In this way, the sum of any current flowing through N4 and N5 is equivalent to the current flowing through N6, and the ratio of current flowing through N4 versus N5 is determined by the voltage across the resistor R, as will be more fully described later in this description. The drains of N4 and N5 provide a second differential output to the differential summing junction 130.

By way of example, the comparator stage 106 comprises the differential summing junction 130, a plurality of current mirrors, and a pair of inverters (INV1, INV2). The summing junction 130 sums corresponding currents output from the first and second differential input stages 102, 104. In this manner, the differential hysteresis output by the stage 104 is applied to the current ratio output by the stage 102. The sum current generated at one node of the summing junction 130 (i.e., an input current with hysteresis) is provided to a current mirror formed by P-channel FETs P1 and P2, while the sum current generated at the other node of the summing junction 130 (i.e., a reference current with hysteresis) is provided to a current mirror formed by FETs P3 and P4.

The source terminals of P1, P2, P3 and P4 are coupled to power (i.e., VDD). The nodes of the summing junction 130 are respectively coupled to the drain terminals of P2 and P3. The drains of P1 and P4 are coupled to the drains of FETs N7 and N8, which serve as input/output connections for a third current mirror. The source terminals of N7 and N8 are coupled to ground.

The third current mirror (N7, N8) causes a difference in the amounts of current flowing through P1 and P4 to flow through the output stage of the comparator 100. In FIG. 1, the output stage is formed by a pair of series of inverters (INV1, INV2) coupled to the drain of P4. The inverters server to buffer and amplify the comparator's output signal. While only a single inverter may be sufficient in some cases, two inverters may provide a stronger output signal and/or both "senses" (i.e., positive and negative) of the comparator's output signal.

The hysteresis control circuit 108 will now be described. As shown, the circuit 108 comprises a resistor (R) and a hysteresis regulating voltage input (Vreg) that are coupled between the differential inputs of the second differential input stage 104.

In the absence of any current flow through the resistor, R, the voltage input, Vreg, provides a means for biasing the inputs of the stage 104 to a common potential. Note that with no current flowing through the resistor, the stage 104 does not impart any hysteresis to input signal Vin. However, if a positive current, I1, is provided to node A of the resistor, R, the stage 104 will impart a hysteresis voltage (Vhyst) of I1R to the input signal. Similarly, if a negative current, I2, is provided to node A, the stage 104 will impart a hysteresis voltage of −I2R to the input signal. In this manner, a positive or negative hysteresis voltage may be applied to the input signal, Vin.

The remainder of the hysteresis control circuit 108 serves to provide the currents I1 and I2 at appropriate times, in response to the comparator's output. To this end, the circuit 108 comprises first and second current generators 110, 112 for respectively generating the currents 11 and 12, and a pair of switches (P7, N11), under control of the comparator output (e.g., V2), to alternately enable the first or second current generators 110, 112 to induce a first or second current (I1, I2) through the resistor (R).

As shown, the first current generator 110 may comprise a number of current generation paths 114, 116, 118, coupled to produce a sum current at node X. The type and number of current generation paths may vary, but in FIG. 1, they comprise a constant current path 114 through FET N12, a switched path 116 through FETs N13 and P8, and a second switched path 118 through FETs N14 and P9. All of the current generation paths 114–118 are coupled between node X and ground. The gates of N12, N13 and N14 are driven by the bias voltage, Vb. The switched current paths 116, 118 are controlled by P8 and P9, the gates of which are respectively driven by control signals S0 and S1.

The sum current at node X is provided to a current mirror comprised of FETs P5 and P6, the source terminals of which are coupled to power. A switch P7 is also coupled between node X and power. The gate of switch P7 is driven by the comparator output node V2. In this manner, the current appearing at node X is mirrored to node A to provide current I1 when V2 is high, and is diverted through switch P7 when V2 is low. As a result, when V2 is low, current I1 is substantially zero.

Similarly to the first current generator 110, the second current generator 112 may comprise a number of current generation paths 120, 122, 124, coupled to produce a sum current at node Y. The type and number of current generation paths may vary, but in FIG. 1, they comprise a constant current path 120 through FET N15, a switched path 122 through FETs N16 and P12, and a second switched path 124 through FETs N17 and P13. All of the current generation paths 120–124 are coupled between node Y and ground. The gates of N15, N16 and N17 are driven by the bias voltage, Vb. The switched current paths 122, 124 are controlled by P8 and P9, the gates of which are respectively driven by control signals S0 and S1.

The sum current at node Y is provided to a current mirror comprised of FETs P10 and P11, the source terminals of which are coupled to power. The current at node Y is thereby mirrored to node Z.

The current at node Z is provided to a second current mirror comprised of FETs N9 and N10, the source terminals of which are coupled to ground. A switch N11 is coupled between the gates of N9 and N10 and ground. The gate of switch N11 is driven by the comparator output node V2, similarly to switch P7. In this manner, the current appearing at node Z is mirrored to node A to provide current I2 when V2 is low, and is diverted through switch N11 when V2 is high. As a result, when V2 is high, current I2 is substantially zero.

In view of the fact that switches P7 and N11 are controlled by the same signal (V2), they switch in unison, thereby causing one or the other of currents I1 or I2 to flow through resistor R and create a positive or negative hysteresis voltage, Vhyst.

By setting the signals S0 and S1, the comparator 100 may be programmed to impart a desired positive and negative hysteresis to the input voltage, Vin. Either or both of S0 and S1 may be controlled discretely or continuously, to thereby incrementally or continuously vary currents I1 and I2. The currents I1 and I2 may also be set by other methods, including, by varying the current mirror ratio of P5 and P6, and by varying the bias voltage Vb.

Figure 2:
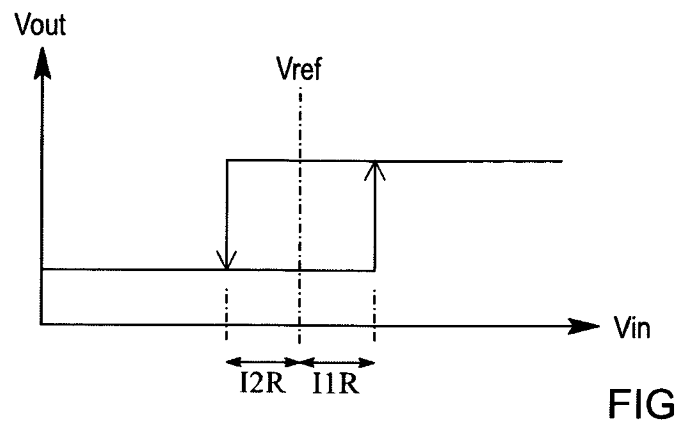
FIG. 2 illustrates the exemplary switching behavior of a comparator with balanced hysteresis.

If corresponding current mirrors of the current generators 110, 112 shown in FIG. 1 are similarly configured, the independent current generators 110, 112 of the circuit 108 provide balanced hysteresis. That is, balanced hysteresis around voltage Vref exists when currents 11 and 12 have equal magnitudes but opposite polarities. See FIG. 2.

Figure 3:
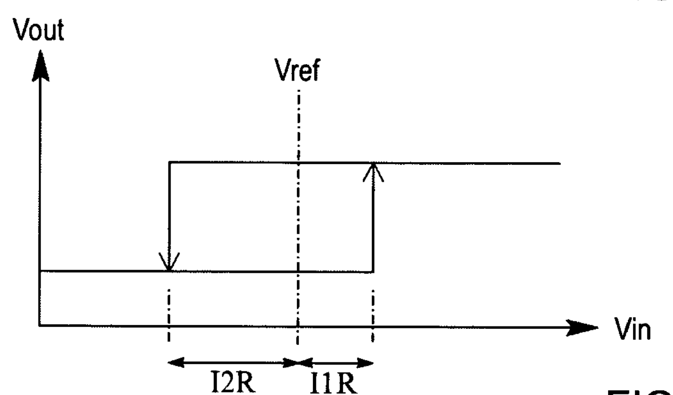
FIG. 3 illustrates the exemplary switching behavior of a comparator with unbalanced hysteresis.

In some cases, it may be desirable to provide unbalanced hysteresis (i.e., hysteresis that is not balanced about Vref). See FIG. 3. Unbalanced hysteresis is achieved by changing the current ratio of currents I1 and I2. Such imbalance may be achieved by means of various modifications to circuit 108. For example, one way to provide unbalanced hysteresis is to replace the control signals (S0, S1) provided to switches P12 and/or P13 with a different set of control signals, such as control signals S0 and S3, or control signals S2 and S3. In this manner, currents I1 and I2 can be individually programmed—giving the option of balanced or unbalanced hysteresis.

Other ways to provide unbalanced hysteresis include: adjusting the current mirror ratios of any or all of the mirrors P5/P6, P10/P11 and N9/N10; adjusting the widths and/or lengths of the different transistors of the current generators 110, 112; or providing different biases to the gates of FETs N12, N13 and N14 versus the gates of FETs N15, N16 and N17.

Figure 4:
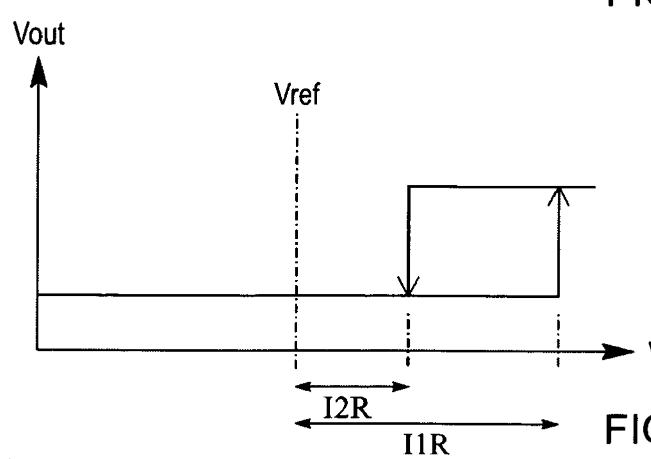
FIGS. 4 & 5 illustrate exemplary switching behaviors of comparators with offset hysteresis.

The hysteresis control circuit 108 may also be modified to provide offset hysteresis, or hysteresis that is offset with respect to reference voltage Vreg. See FIGS. 4 & 5. FIG. 6 therefore illustrates a comparator 600 providing positive offset hysteresis, and FIG. 7 illustrates a comparator 700 providing negative offset hysteresis.

The comparator 600 (FIG. 6) is similar to the comparator 100. As a result, common FETs are provided with common designators, and some portions of the comparator stage 106 are not shown. In the comparator 600, the current generator 110 is configured as previously described, but a number of modifications have been made to the current generator 112 (now current generator 612). That is, in the current generator 612, the current mirror formed by N9 and N10 has been eliminated, and node Z has been merged with node A. Switch N11 has also been eliminated, and replaced by a switch P14 coupled between node Y and power. The gate of switch P14 is driven by Vout. In this manner, switches P7 and P14 alternately provide current I1 and I2 to the resistor R. However, currents I1 and I2 now have the same polarity. If corresponding components of the current generators 110, 612 are matched, the currents I1 and I2 will be the same current. However, if switch sets P8/P9 and P12/P13 are provided with different sets of control signals, or if the current mirrors P5/P6 and P10/P11 are provided with different current mirror ratios, the currents I1 and I2 will result in different amounts of positive hysteresis being provided with respect to reference voltage Vref. In other words, they will result in positive offset hysteresis. See FIG. 4.

In some cases, the comparator 600 may be modified to eliminate the switch P7 or P14. In this manner, one of the current generators 110, 612 always provides a current to the resistor, R, and the other current generator periodically adds or subtracts a second current to the first. For example, as demonstrated by the plot shown in FIG. 5, the switch P14 could be eliminated so that the second current generator 612 provides a constant current I2 to the resistor R. The first current generator 110 could then be alternately enabled so that, at times, the current (I1+I2) is provided to the resistor R.

The comparator 700 (FIG. 7) is also similar to the comparator 100. As a result, common FETs are provided with common designators, and some portions of the comparator stage 106 are not shown. In the comparator 700, the current generator 112 is configured as previously described, but a number of modifications have been made to the current generator 110 (now current generator 710). That is, the current generator 710 now comprises a second current mirror formed by FETs N18 and N19. The current mirror N18/N19 is similar in construction to the current mirror N9/N10 and is coupled to the current mirror P5/P6 at a node B. Also in the comparator 700, switch P7 of comparator 100 has been eliminated and replaced by a switch N20 coupled between the gates of N18 and N19 and ground. The gate of the switch N20 is driven by Vout. In this manner, switches N11 and N20 alternately provide current I1 and I2 to the resistor R. However, currents I1 and I2 both have a negative polarity. If corresponding components of the current generators 710, 112 are matched, the currents I1 and I2 will be the same current. However, if switch sets P8/P9 and P12/P13 are provided with different sets of control signals, or if the current mirrors P5/P6 and P10/P11 or N9/N10 and N18/N19 are provided with different current mirror ratios, the currents I1 and I2 will result in different amounts of negative hysteresis being provided with respect to reference voltage Vref. In other words, they will result in negative offset hysteresis.

Figure 5:
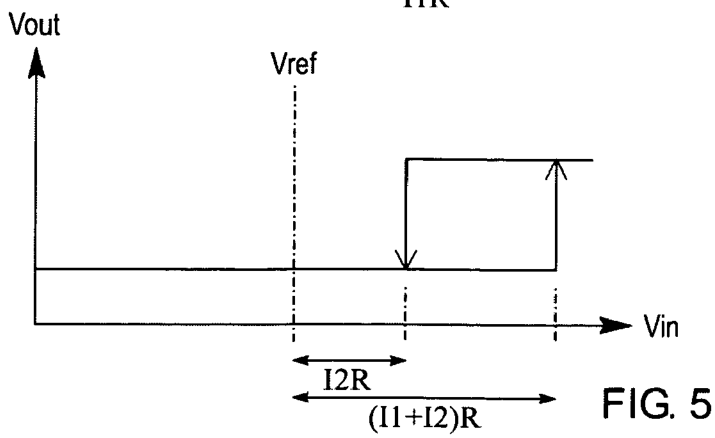
Figure 6:
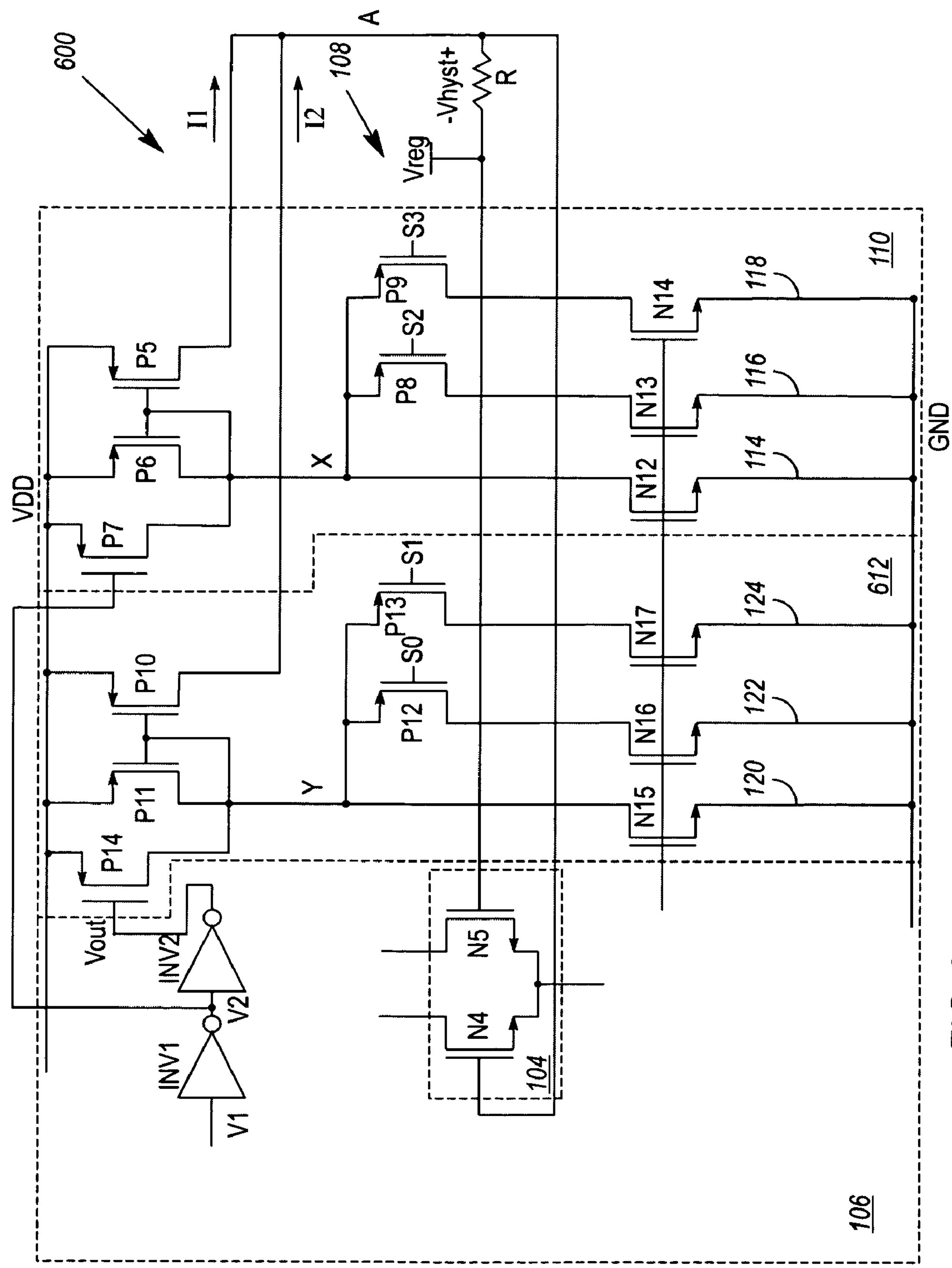
FIG. 6 illustrates an exemplary embodiment of a comparator with positive offset hysteresis.
Figure 7:
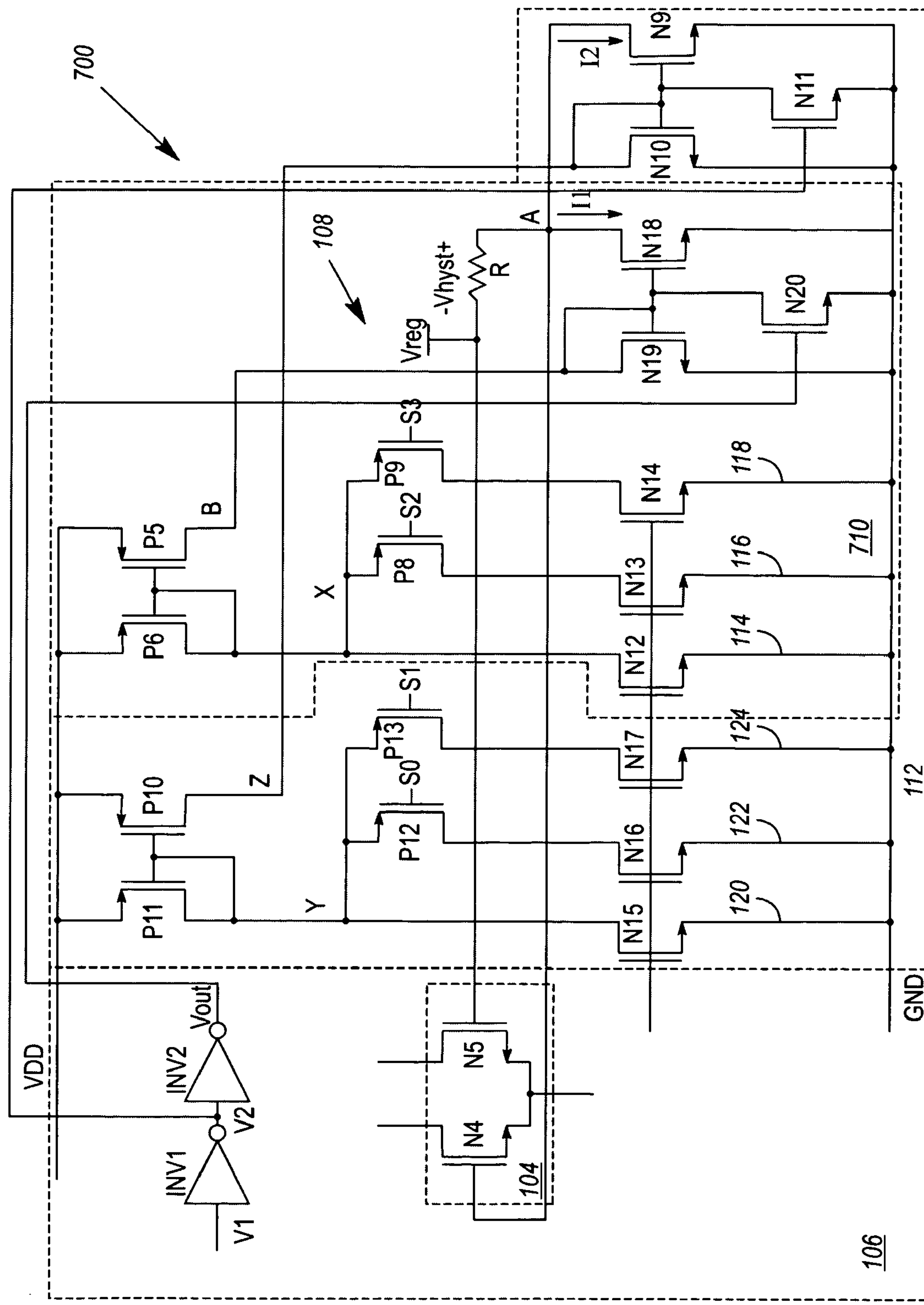
FIG. 7 illustrates an exemplary embodiment of a comparator with negative offset hysteresis.

As was described with respect to FIGS. 5 & 6, the switch N11 or N20 could be eliminated, and a negative offset hysteresis could be generated by means of additive currents (or differential currents).

Figure 8:
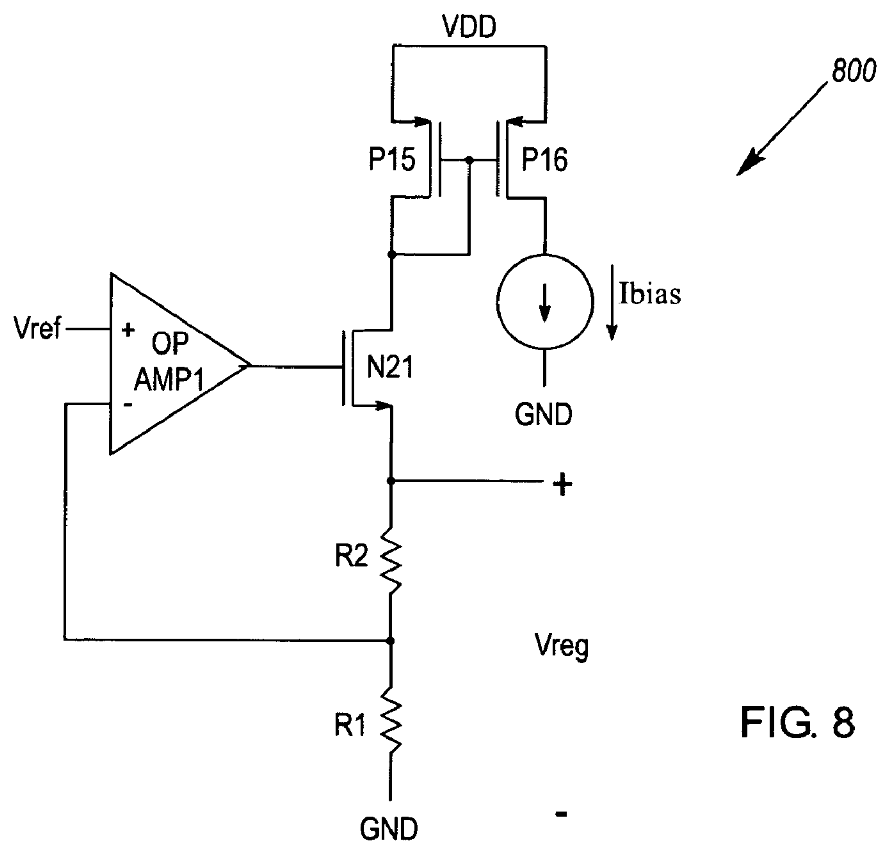
FIG. 8 illustrates an exemplary circuit for deriving a hysteresis regulating voltage from a reference voltage.

The hysteresis regulating voltage, Vreg, provided to the comparators 100, 500, 700 may be derived in various ways. In one embodiment, it is derived from reference voltage Vref as shown in FIG. 8. That is, a bias current (Ibias) is mirrored to the drain terminal of a FET N21 via a current mirror comprised of FETS P15 and P16. The source terminal of the FET N21 is coupled in series with a voltage divider comprised of resistors R1 and R2. The midpoint of the voltage divider is coupled to one input of an operational amplifier, OPAMP1, and the reference voltage, Vref, is coupled to the other input of the comparator. The output of the comparator drives the gate of N21. In this manner, the voltage Vreg may be obtained while only minimally impacting the reference voltage.

The exemplary comparators 100, 500, 700 have a variety of applications, including, as analog-to-digital converters, as data transmission components (e.g. infrared transceivers), and as switching power regulators.

Depending on their configuration and application, the comparators 100, 500, 700 may provide various advantages over other comparators. For example, they may provide for the control of a receiver's sensitivity through hysteresis adjustment instead of gain adjustment. By matching corresponding components of the first and second current generators (e.g., by matching layouts and FET dimensions, and by cross-coupling matched FETs), the comparators 100, 500, 700 also provide a way to mitigate the influences of process and temperature on hysteresis generation. The comparators 100, 500, 700 also provide a way to mitigate the effects of input stage trans-conductance on hysteresis generation.

Figure 9:
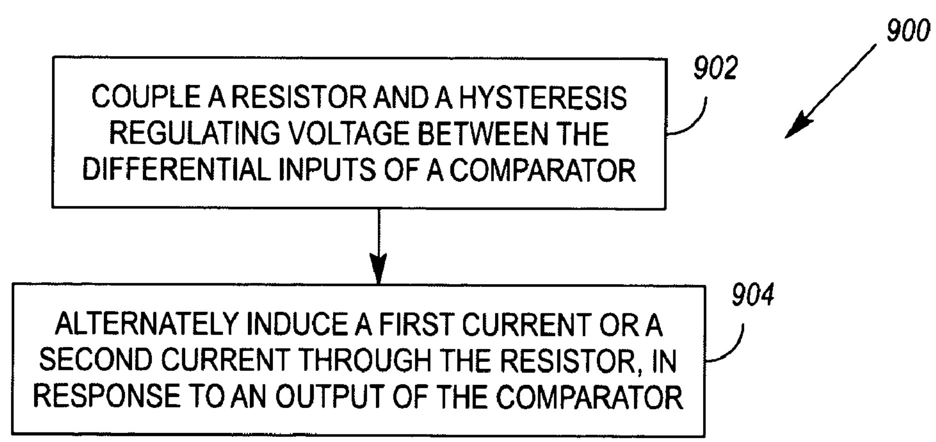
FIG. 9 illustrates an exemplary method for generating a hysteresis voltage between the differential inputs of a comparator.

FIG. 9 illustrates a method 900 that may be used to generate a hysteresis voltage between the differential inputs of a comparator such as any of those shown in FIG. 1, 6 or 7. The method comprises 1) coupling 902 a resistor and a hysteresis regulating voltage input between the differential inputs, and 2) alternately inducing 904 a first current or a second current through the resistor, in response to an output of the comparator.

What is claimed is:

1. A comparator with hysteresis, comprising:

a first differential input stage receiving an input voltage and a reference voltage and producing a first differential output;

a second differential input stage having differential inputs and producing a second differential output;

a comparator stage producing a comparator output in response to said first and second differential outputs; and a hysteresis control circuit, comprising i) a resistor and a hysteresis regulating voltage input, coupled between the differential inputs of the second differential input stage, ii) first and second current generators, and iii) at least one switch, under control of the comparator output, to alternately enable different ones of the first and second current generators, thereby inducing a first or a second current through the resistor.

2. The comparator of claim 1, wherein the first and second current generators each comprise:

a number of current generation paths, coupled to produce a sum current; and a number of switches to control current flow through at least some of the current generation paths.

3. The comparator of claim 2, wherein the first and second current generators each comprise a number of current mirrors to mirror the generator's sum current to one end of the resistor.

4. The comparator of claim 3, wherein corresponding current mirrors of the first and second current generators are similarly configured.

5. The comparator of claim 4, wherein the first and second current generators respectively source and sink current to one end of the resistor.

6. The comparator of claim 4, wherein the first and second current generators both source current to one end of the resistor.

7. The comparator of claim 4, wherein the first and second current generators both sink current from one end of the resistor.

8. The comparator of claim 3, wherein corresponding current mirrors of the first and second current generators comprise different ratios of transistors.

9. The comparator of claim 2, wherein the current generation paths and switches of the first current generator are matched to the current generation paths and switches of the second current generator, and wherein corresponding switches of the first and second current generators receive the same switching signal.

10. The comparator of claim 9, further comprising an infrared input stage to provide said input voltage to said first differential pair.

11. The comparator of claim 2, wherein the current generation paths and switches of the first current generator are matched to the current generation paths and switches of the second current generator, and wherein the current generation paths of different current generators receive a different set of switching signals.

12. The comparator of claim 1, wherein:

the at least one switch comprises at least a pair of switches, one of which corresponds to each of the first and second current generators; and the hysteresis control circuit operates the pair of switches to alternately enable the first current generator or the second current generator.

13. The comparator of claim 1, wherein the first and second current generators respectively source and sink current to one end of the resistor.

14. The comparator of claim 1, wherein the first and second current generators both source current to one end of the resistor.

15. The comparator of claim 1, wherein the first and second current generators both sink current from one end of the resistor.

16. The comparator of claim 1, further comprising a circuit to derive the hysteresis regulating voltage from the reference voltage.

17. The comparator of claim 1, further comprising an infrared input stage to provide said input voltage to said first differential pair.

* * * * *